United States Patent [19]

Gulla et al.

[11] Patent Number: 4,482,596
[45] Date of Patent: Nov. 13, 1984

[54] ELECTROLESS ALLOY PLATING

[75] Inventors: Michael Gulla, Sherborn; Oleh B. Dutkewych, Harvard, both of Mass.

[73] Assignee: Shipley Company Inc., Newton, Mass.

[21] Appl. No.: 411,346

[22] Filed: Aug. 25, 1982

Related U.S. Application Data

[60] Division of Ser. No. 308,778, Oct. 5, 1981, , which is a continuation-in-part of Ser. No. 187,552, Sep. 15, 1980, abandoned.

[51] Int. Cl.³ .......................... B32B 3/10; B32B 15/04
[52] U.S. Cl. .................... 428/131; 106/1.23; 428/412; 428/418; 428/419; 428/446; 428/457; 428/458; 428/461; 428/464; 428/465; 428/901
[58] Field of Search ............... 428/457, 131, 548, 901, 428/458, 461, 464, 465, 412, 419, 418, 446; 427/304, 309, 305; 106/1.23; 29/115, 195; 75/170

[56] References Cited

U.S. PATENT DOCUMENTS

| | | | |
|---|---|---|---|
| 3,403,035 | 9/1968 | Schneble et al. | 106/1.23 |
| 3,692,502 | 9/1972 | Bernhardt et al. | 29/195 |
| 3,726,707 | 4/1973 | Prosser et al. | 427/309 |
| 3,832,168 | 8/1974 | Gulla | 75/170 |
| 3,935,013 | 1/1976 | Lelental | 427/304 X |
| 4,209,331 | 6/1980 | Kukanskis et al. | 106/1.23 |
| 4,265,943 | 5/1981 | Goldstein et al. | 427/305 |

FOREIGN PATENT DOCUMENTS 109669  11/1974  German Democratic Rep. .................. 106/1.23

Primary Examiner—Thomas J. Herbert, Jr.
Attorney, Agent, or Firm—Robert L. Goldberg

[57] ABSTRACT

A structure having a catalytic surface plated with an autocatalytic electroless alloy of copper, a metal selected from nickel, cobalt, mixtures thereof and phosphorous.

30 Claims, 4 Drawing Figures

ELECTROLESS ALLOY PLATING

CROSS REFERENCE TO RELATED APPLICATIONS

The subject application is a division of copending U.S. Patent Application Ser. No. 308,778 filed Oct. 5, 1981 which application is a continuation-in-part of U.S. Patent Application Ser. No. 187,552 filed Sept. 15, 1980, now abandoned.

BACKGROUND OF THE INVENTION
1. Field of the Invention

The invention relates to autocatalytic electroless depositing compositions, processes for use of the same, autocatalytic alloy deposits formed therefrom, substrates coated with said electroless alloys and optionally overcoated with an electroless metal and to a means for transforming a hypophosphite solution that is not autocatalytic to one that is autocatalytic.

2. Description of the Prior Art

Electroless metal deposition refers to the plating of a metal from solution over a suitable surface by chemical action in the absence of an external electric current. Processes and compositions useful therefor are known in the prior art and described in numerous publications.

There are several methods by which metal may be deposited over a substrate without the use of an external source of electricity. One method, known as immersion or displacement plating, depends upon a galvanic displacement between a metal in solution and a metal comprising a substrate to be plated. For example, tin is plated over copper from solution by the tin displacing the copper on the surface of the substrate plated. Plating continues for as long as copper is available to be displaced by the tin. Once the copper is completely coated by the tin, and copper is no longer available for displacement, plating stops or slows to the point where there is only an infinitessimal increase in deposit thickness with time. Deposits having a thickness of from about 1 to 100 millionths or more of an inch are obtainable by displacement plating, depending upon the porosity of the deposit and the displacement potential between the metal of the substrate and the metal to be displaced.

Plating by chemical reduction is another electroless method for depositing metal over a substrate. Plating takes place by the action of a reducing agent on dissolved metal in the presence of a catalytic surface. The catalytic surface may be a metal substrate or a catalyzed non-metallic substrate. Plating continues for so long as catalytic surface is present to initiate or cause the plating reaction to continue.

Solutions for plating by chemical reduction are either autocatalytic or they are not autocatalytic. Those solutions that are not autocatalytic provide a metal plate which is not catalytic to continued plating. Therefore, once the initial catalytic surface is covered by the metal plate, the plating reaction stops or slows to the point where there is only an infinitessimal increase in deposit thickness with time. Metal plated from a solution that is not autocatalytic is often referred to as a "flash plate" and typically, the thickness of such deposits vary between about 1 and 30 millionths of an inch.

Autocatalytic plating solutions are solutions that deposit a metal plate which itself is catalytic to continued deposition. Consequently, theoretically, metal may be deposited continuously so long as the composition of the plating solution is maintained and deposits of considerable thickness are obtainable. Autocatalytic plating solutions typically plate at a rate of from about 30 to 500 millionths of an inch per hour and the desired deposit thickness is dependent upon the use of the metal plate.

The invention described below is an autocatalytic plating solution for alloys of copper, nickel and/or cobalt and phosphorus. The discussion which follows will therefore be directed to autocatalytic plating solutions unless otherwise stated. Such solutions will be referred to generically as electroless plating solutions as in common in the art.

The two metals most commonly plated by chemical reduction from electroless solutions are nickel-phosphorus alloys and copper. Each has advantages and disadvantages which limit its utility to specific applications. Electroless nickel is most frequently used for metal finishing and plating on plastics where economy is a concern, while electroless copper is most frequently used in the electronics industry, such as in the manufacture of printed circuit boards and semiconductors, and in those automotive plating on plastics applications where electroless nickel is not satisfactory.

Electroless processes for plating nickel phosphorus alloys and compositions useful therefor are described in numerous patents, for example, U.S. Pat. Nos. 2,690,401; 2,690,402; 2,762,723; 2,935,425; 2,929,742; 3,062,666; 3,338,726; 4,042,382 and 4,167,416, all included herein by reference.

Known autocatalytic electroless solutions for plating nickel-phosphorus alloys generally comprise a reaction mixture consisting of at least four ingredients dissolved in a solvent, typically water. They are (1) a source of nickel ions, (2) a hypophosphite compound as a reducing agent, (3) an acid or hydroxide pH adjustor to provide required pH and (4) a complexing agent for metal ions sufficient to prevent their precipitation from solution. Many electroless nickel solutions are described in the above-noted patents. Hypophosphite as the reducing agent is the source of phosphorus in the alloy. Electroless nickel-boron alloys can be formed using a boron compound as a reducing agent such as dimethyl amine borane but most plating solutions use hypophosphite as the reducing agent because it is substantially less expensive and easier to use than the boron compounds.

Autocatalytic electroless copper plating solutions and processes for their use are also well known in the prior art and described in numerous patents including U.S. Pat. Nos. 3,046,159; 3,310,430; 4,118,234; 4,143,186; 4,167,601; and 4,171,225, all incorporated herein by reference. Known electroless copper deposition solutions also generally comprise at least four ingredients dissolved in a solvent, typically water. They are (1) a source of copper ions, (2) a reducing agent such as formaldehyde or a boron compound such as a borohydride or an amine borane, (3) a pH adjustor to provide required pH and (4) a complexing agent for the copper ions sufficient to prevent their precipitation from solution. Many electroless copper formulations are described in the above-noted patents. The most frequently used copper plating solutions use formaldehyde as the reducing agent.

As noted above, the properties of electroless nickel solutions and the deposits plated therefrom make electroless nickel useful for plating on plastic applications where the ease of operation is important.

Electroless nickel solutions using hypophosphite as the reducing agent are easier to use than copper plating solutions for many reasons. The solutions are usually more stable than electroless copper solutions and consequently, have s substantially greater tolerance for contamination as a consequence of drag-in during the conventional plating sequence. Therefore, such solutions are not likely to undergo spontaneous decomposition resulting in loss of the plating solution. In addition, hypophosphite does not undergo undesirable side reactions as does formaldehyde in alkaline electroless copper solutions. Therefore, there is minimal need for expensive equipment to monitor the concentration of components in solution as is frequently required for electroless copper plating solutions. Moreover, hypophosphite is not considered toxic. Consequently, nickel is frequently preferred for use as a base for subsequent electroplating.

Nickel as a conductive coating for electroplating has advantages in addition to low cost. Nickel deposited from electroless nickel solution is not readily burned off by current passing through it during electroplating and the nickel deposit is not readily etched by electroplating solutions. Consequently, nickel is suitable for many plating on plastic operations. Also, electroless nickel has less tendency to plate onto plastisol coated racks, thereby making it especially desirable for straight through processing.

There are disadvantages to the use of nickel as a base metal for electroplating that limits its use for many applications. Nickel, though an electrical conductor, is a poor conductor for electrolytic overcoating. Consequently, large and/or irregularly shaped parts are not readily electroplated over nickel as a base metal and spread of the electroplated deposit from solution is slow, often causing substandard adhesion of the electroplated metal. Nickel deposits, upon standing, tend to passivate, thereby causing plating problems, such as poor adhesion. Further, because nickel is superior to copper with respect to etching, this may be a disadvantage because plated parts that are rejected can not be easily reworked. Thermal cycling is also a problem with nickel as a base metal over plastic because corrosion penetration undercuts adhesion to the plastic. Hence, when temperature extremes are encountered, particularly in automotive parts, delamination of metal from the plastic frequently occurs. This is a serious drawback to the use of nickel for applications where exposure to outside weather extremes is a requirement. Finally, most electroless nickel solutions that are used for plating on plastics contain ammonia, thereby creating waste treatment problems.

It is known that copper has some properties which make it superior to nickel as a base for electroplating for many plating on plastics operations. However, the majority of the electroless copper plating solutions used commercially contain formaldehyde as a reducing agent thereby causing many difficulties in operation and performance. Formaldehyde in alkaline plating solutions is relatively unstable and consequently more difficult to control than hypophosphite in nickel solution. A major reason for this is the volatility of formaldehyde coupled with the known Cannizarro side reaction that takes place in the alkaline bath which combine to consume formaldehyde not consumed by the primary plating reaction. The result is a constantly changing, frequently unpredictable, formaldehyde concentration in solution that required careful monitoring, frequently with expensive monitoring equipment. In addition, the degradation of formaldehyde often is accompanied by a loss of hydroxide. Failure to monitor the concentration of components in a copper plating solution may result in spontaneous decomposition of the solution and deposits of varying quality. Finally, formaldehyde is toxic and highly volatile and its fumes are very irritating. Consequently, substantially greater care is now needed in the use and waste treatment of formaldehyde containing solutions.

Notwithstanding the problems associated with copper plating solutions using formaldehyde as the reducing agent, such solutions are used in significant quantity for plating on plastic operations in the automotive industry because of the superior performance of copper as a base metal for subsequent electroplating. The reasons are better conductivity of copper relative to nickel which permits plating of large and/or irregularly shaped parts, and the ability of parts plated with copper, then subsequently electroplated, to withstand thermal cycling.

The above discussion has been limited to the plating on plastics industry. In the electronics industry, nickel-phosphorus alloy, because of relatively poor conductivity, has found little or no application, notwithstanding the advantages associated with the use of nickel plating solutions. Instead, copper is the metal used for the formation of conductors over various substrates. Virtually all copper used in the electronics industry is plated from formaldehyde based solutions.

Based upon the above, electroless alloy solutions of the two metals would appear to be desirable and attempts to plate such alloys are described in the prior art.

One electroless solution used for plating alloys of nickel and copper over plastics is disclosed in U.S. Pat. Nos. 3,547,784 and 3,692,502, both incorporated herein by reference. The solution disclosed in each of these patents is essentially a formaldehyde copper plating solution to which a nickel salt is added in a weight ratio of approximatey 4 parts copper to 1 part nickel. Since the solution utilizes formaldehyde as the reducing agent, it is subject to the same disadvantages as the conventional formaldehyde copper baths described above.

Another patent disclosing alloy solutions of copper and nickel is U.S. Pat. No. 3,935,013. This patent teaches that alloys of from 9 to 98 mole percent copper and from 2 to 91 mole percent nickel can be obtained by mixing salts of nickel and copper together in a solution containing a reducing agent, complexing agent and a pH adjustor. The reducing agent is disclosed in Column 2, line 62 to Column 3, line 5 as any reducing agent which reduces both copper and nickel ions. Borane reducing agents are disclosed in the working examples but others, including hypophosphite, are disclosed in the above-cited portion of the patent. However, it is believed that if hypophosphite were substituted for the amine-boranes of the examples, the solutions would not be autocatalytic, particularly those solutions having a copper content in excess of several percent by weight copper.

In U.S. Pat. No. 3,832,168, hypophosphite plating solutions are disclosed for deposition of nickel and copper alloys. Though it is not explicitly disclosed in the patent, the patentees teach that codeposited copper in excess of 25 percent by weight was not obtainable. No solutions are taught having a copper content of at least 5 percent by weight.

An effort to obtain an alloy of copper and nickel from a hypophosphite plating solution is reported by Aoki, Takano and Ishibashi in the *Journal of The Metal Finishing Society*, Japan, Volume 30, No. 3, 1979. The authors report that they were able to obtain deposits containing up to 69 percent by weight copper from a plating solution containing 0.085 moles of nickel sulfate and 0.015 moles of copper sulfate using hypophosphite as a reducing agent when the pH of the solution was adjusted to about 10 with sodium hydroxide (though it should be noted that there is some inconsistency in the publication as from time to time, the 0.015 moles of copper sulfate is written as 0.15 moles). The authors appear to have been unsuccessful in obtaining a higher concentration of codeposited copper because of an inability to obtain an operative plating solution containing more than 20 mole percent copper, the higher concentrations of copper apparently acting to depress or inhibit plating. Moreover, to obtain deposition, the authors found it necessary to induce plating electrolytically. It is believed that the deposits obtained from these solutions were not autocatalytic and deposition was extremely slow.

Another publication relating to the formation of copper-nickel-phosphorus alloys is East German published patent application Ser. No. 109,669, bearing a publication date of Nov. 12, 1974. This publication discloses electroless solutions of nickel sulfate, copper sulfate, citric acid, sodium hypophosphite and in one example, sodium tetraborate. The author suggests that the concentration of citric acid relative to the concentration of the copper and nickel salt is important and that increasing the concentration of citric acid requires an increase in the concentration of the nickel salt relative to the copper salt. This is illustrated in Examples 1 and 2 where a doubling of the citric acid concentration necessitated an increase in the ratio of the nickel salt relative to the copper salt of from 50 to 100 percent in order to obtain a homogeneous deposit. It is believed that the publication fails to disclose any autocatalytic formulation having a copper salt concentration at least equal to the nickel salt concentration. Sodium tetraborate is disclosed as an optional ingredient in several of the examples. Its function is not stated, but it is believed that it acts as a buffer.

A recent patent directed to efforts to plate copper from solutions using a hypophosphite compound as a reducing agent is U.S. Pat. No. 4,209,331. The patent teaches that plating is achieved by optimizing pH for any given complexing agent. In several examples within the patent, nickel salt is added to the plating solution to determine if it promotes deposition, but it is concluded by the patentee that the nickel provides little or no benefit. A careful review of the patent establishes that only thin deposits are obtained before plating stops or slows to an infinitessimally small plating rate. Consequently, the plating solutions of this patent are believed to be non-autocatalytic electroless solutions.

A more recent patent, assigned to the same assignee as the aforesaid patent, is U.S. Pat. No. 4,265,943, incorporated herein by reference. This patent is directed to copper plating solutions using hypophosphite as a reducing agent. The patent teaches that maintaining the pH of the plating solution at a pH preferably within the range of 11 to 14 while adding a minor amount of nickel or cobalt ions permits plating of copper at a substantially constant rate. In all of the examples withint the patent, the plating solutions have a pH in excess of 11 and a second metal ion concentration less than 10 mole percent.

SUMMARY OF THE INVENTION

The present invention provides plating solutions for depositing autocatalytic alloys of copper, a metal from the group of nickel, cobalt and mixtures thereof and phosphorus. The copper in the alloy deposit that can be obtained from solutions disclosed herein can range in concentration from a trace to almost pure copper. The plating solution utilizes hypophosphite as a reducing agent and is characterized by the addition to solution of an autocatalytic promoter.

The term autocatalytic, as applied to the alloy deposits of this invention, means that the alloy plated over a substrate is catalytic to the continuous deposition of additional metal. Accordingly, if a substrate having a catalytic surface is immersed in the plating solution of this invention, plating will continue beyond the point where the original catalytic surface is fully coated because the metal deposited from solution is catalytic to additional plating. Hence, the term is used to distinguish the deposits of this invention from immersion deposits and from non-autocatalytic deposits formed over a catalytic surface by chemical reduction. Theoretically, metal will continue to plate from solution over the deposits of this invention indefinitely at a substantially continuous plating rate. However, as is well known in the art, there are practical limitations to indefinite plating. For example, the chemistry of the plating solution must be maintained by replenishment so that there is no unacceptable depletion of solution components and plating conditions should be held constant. In addition, the part cannot be removed from solution during plating for any extended period of time and then reimmersed into solution as removal of the part from the plating environment might passivate the same. Finally, as the deposit becomes increasingly thick, beyond flash plate thickness, the plating rate might decrease somewhat, but plating at an acceptable rate will continue.

Where the term autocatalytic is used to describe the alloy deposits of this invention, it means that the alloy deposits are catalytic to the deposition of additional metal from the plating solution. However, the term should not be construed as restricting the alloys of the invention to thick deposits as the term is used merely to characterize the deposit and not define its thickness. In this respect, thin alloy deposits are useful for many industrial applications even though continuous plating is not necessary to form thin deposits.

The mechanism by which autocatalytic alloys are deposited from the plating solutions of this invention is not fully understood though certain characteristics of the solution are known. For example, copper will not continuously plate from a solution free of nickel and cobalt. In order for the deposit to be autocatalytic and plate at a commercial acceptable rate in accordance with this invention—i.e., in excess of 5 millionths of an inch per 10 minute period, the plating solution contains a non-metallic autocatalytic promoter. In the absence of the autocatalytic promoter, for solutions having a pH generally below 11 to 12, a plating solution containing up to about 5 weight percent dissolved copper might plate an autocatalytic deposit, but the copper content of the deposit will be low-typically less than 15 weight percent of the total deposit. If the dissolved copper content is increased above 5 weight percent and as it approaches 25 weight percent, a deposit generally will form, but the rate of deposition will decrease as the copper content increases and the deposit formed would, in all likelihood, not be autocatalytic. Above about 25 weight percent dissolved copper, the plating rate generally would be reduced to substantially zero. The percentages above are approximations set forth as a general guideline. Exact percentages are dependent upon the specific plating solution and conditions used. For example, increasing the temperature of the plating solution can force the plating reaction to proceed thus increasing the amount of dissolved copper that can be tolerated in solution. Increasing the pH, typically above 11 to 12, with certain complexing agents, can also result in the autocatalytic deposition of copper from solutions having a high copper content. When an autocatalytic promoter in adequate concentration is added to a hypophosphite type plating solution, continuous plating at a rate in excess of 5 millionths per 10 minutes at a given temperature is readily accomplished for many solutions using an adequately replenished solution at a solution pH below 11. With some complexing agents, an autocatalytic deposit can be formed even with a dissolved copper content approaching 95 percent by weight or more. Such solutions typically yield alloys having a copper content in excess of 95 percent by weight and may contain copper in an amount as high as 99 percent or more.

The use of an autocatalytic promoter in a hypophosphite type plating solution for copper alloys provides several advantages. Its use permits autocatalytic deposition of copper alloys from some solutions otherwise incapable of depositing autocatalytic deposits. In this respect, autocatalytic deposits can be obtained from certain solutions at a pH below that pH whereby autocatalytic deposits can be obtained in the absence of a promoter, thus permitting significant expansion of the usable pH range. For some plating solutions, the use of an autocatalytic promoter enhances or exalts plating rate. This exaltation is particularly noticeable at about the lower operable limit of pH for a plating solution capable of plating without an autocatalytic promoter. The autocatalytic promoter also appears to enhance solubility of the plating metal in solution, dependent upon the complexing agent used.

The autocatalytic promoters are typically compounds having oxy anions such as carbonates and borates though some oxy compounds have been found to be ineffective and some have been found to be poisons. The determination of whether a particular compound is a catalytic poison is a matter of routine experimentation.

In addition to the above, it has been discovered that ammonia in solution, either as a complexing agent or as a pH adjustor, might inhibit the deposition of copper unless pH is carefully controlled. Consequently, ammonium hydroxide in significant concentration is preferably avoided where a high concentration of copper is desired in the alloy deposit but the avoidance of ammonia is not mandatory. A further characteristic of the plating solution is that its pH should exceed 7 and preferably, should vary below about 8.0 and 14.0.

It is one discovery of this invention that the autocatalytic electroless alloys of copper, nickel and phosphorus containing in excess of 70 percent copper, and preferably in excess of 80 percent copper, are suitable as conductors in printed circuit board manufacture. They possess hybrid properties of both copper and nickel that also make the alloy especially desirable for use as a conductive coating for plating on plastic applications to be followed by electroplating. For example, an alloy of approximately 85 percent copper, 14 percent nickel and the balance assumed to be phosphorus has electrical conductivity approaching that of pure copper, but the alloy's resistance to corrosion and electrical burn-off is superior to that of pure copper. Hence, the alloy is a hybrid of copper and nickel with the alloy possessing the more desired properties of each.

Autocatalytic alloys containing at least 70 percent copper, at least 0.1 percent phosphorus, with the balance nickel, are believed to be new alloys and especially preferred for purposes of this invention. Autocatalytic alloys containing at least 25 percent copper, with at least 0.1 percent phosphorous and the balance cobalt, are also believed to be new alloys.

Alloys having a copper content in excess of 70 weight percent with nickel and/or cobalt and phosphorus possess excellent conductivity, and are therefor useful for substantially the same electronics applications as electroless copper from formaldehyde solutions. Moreover, when the copper content exceeds 70 percent, the plated parts do not passivate and possess the etch characteristics of copper. Additionally, since the copper is deposited from hypophosphite solution, the plating solution possesses the advantages of prior art electroless nickel—hypophosphite type plating solutions in that they are easier to use and control and consequently, the alloy deposits may be used for substantially the same plating on plastics purposes as the nickel—phosphorus deposits of the prior art.

Accordingly, one object of this invention is to provide novel autocatalytic alloy deposits having physical and chemical properties not heretofore available in the art, which alloys are useful for many applications including use as a base metal over plastic for subsequent electroplating for decorative and electronics applications.

Another object of this invention is provision of an electroless plating solution capable of continuously depositing autocatalytic alloys of copper, nickel or cobalt and phosphorus, particularly autocatalytic alloys having a high concentration of copper, from a plating solution using hypophosphite as a reducing agent.

A further object of this invention is the discovery of autocatalytic promoters for electroless alloy plating solutions that enhance the plating rate and permit continuous deposition of copper in substantially any concentration from a solution using hypophosphite as a reducing agent.

Another object of this invention is a new article of manufacture comprising a substrate plated with alloys of copper, nickel or cobalt and phosphorus and optionally overplated with an additional metal.

Another object of this invention is the discovery of autocatalytic promoters which permit the use of hypophosphite as a reducing agent to reduce copper to metallic form and which enhance plating rate.

A further object of this invention is the use of autocatalytic promoters to convert non-autocatalytic plating solutions to autocatalytic plating solutions.

Other objects and advantages of this invention will become apparent from the description which follows.

DESCRIPTION OF THE PREFERRED EMBODIMENTS

Figure 1:
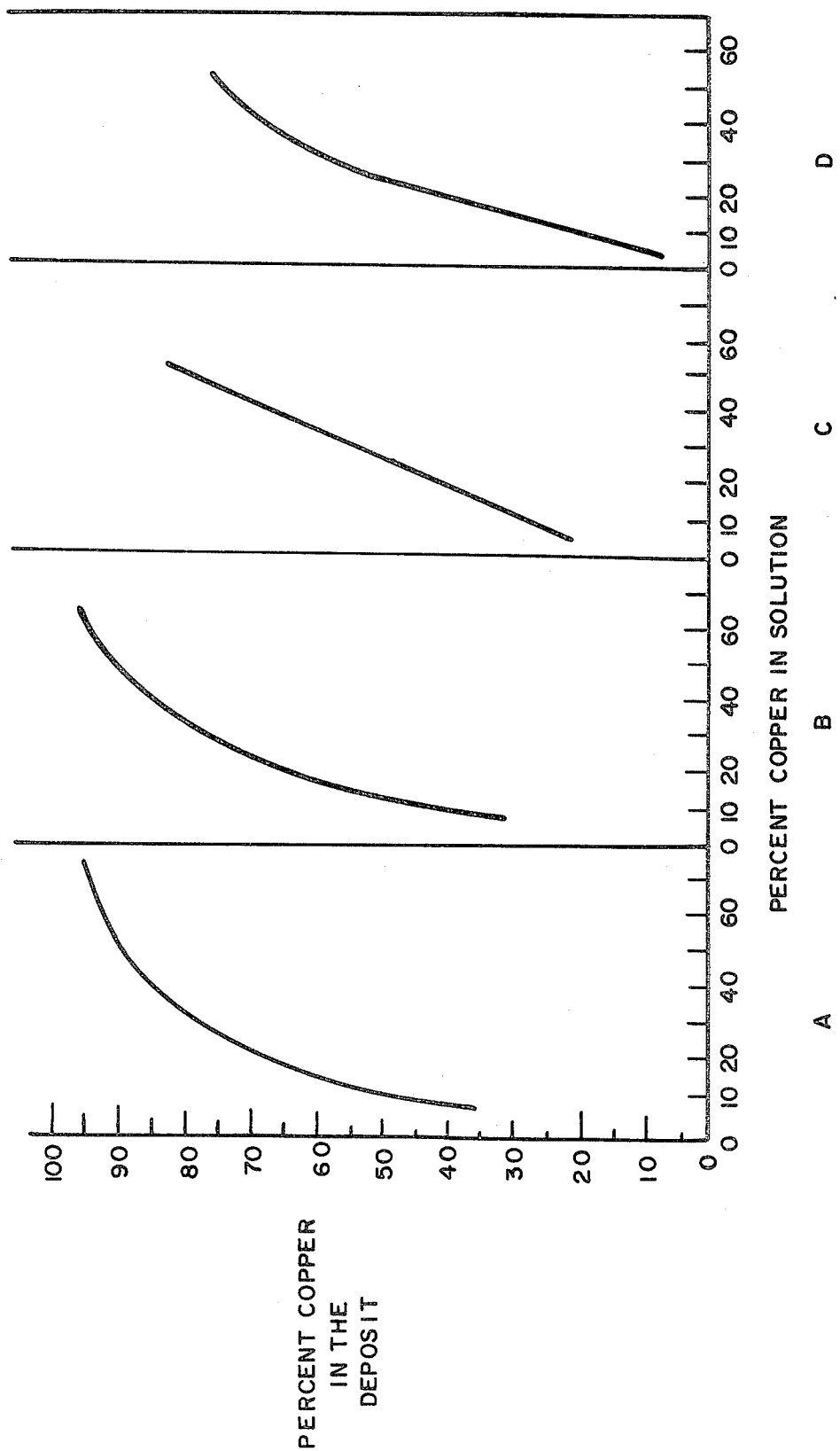
FIG. 1 is a graphical representation of copper concentration in several alloy deposits as a function of copper concentration in several plating solutions.

Electroless solutions for depositing alloys in accordance with this invention are alkaline and comprise (1) a source of copper ions, (2) a source of nickel or cobalt ions, (3) a complexing agent to maintain said ions in solution, (4) hypophosphite as a reducing agent and (5) an autocatalytic promoter.

The source of the plating metal ions can be any of the metallic salts conventionally used for electroless plating, sulfates and chlorides of nickel, cobalt and copper being preferred. Additional examples of metallic salts can be found in the above referenced patents.

The complexing agents used to maintain the plating metal in solution can be either a single complexing agent for all metals dissolved in solution or a mixture of compatible complexing agents specifically formulated for the mixture of metals in solution. Most complexing agents known in the art for use in electroless copper and nickel are suitable though it is a discovery of this invention that ammonium hydroxide might inhibit the codeposition of higher concentrations of copper if its concentration becomes excessive. Accordingly, though ammonium hydroxide is acceptable, it is lesser preferred. Where used, it is desirable to use higher concentrations of the autocatalytic promoter.

Preferred complexing agents are hydroxy substituted carboxylic acids such as gluconic acid, citric acid, sulfosalicylic acid and malic acid, citric acid being most preferred. Other complexing agents are the amine complexing agents, especially alkanolamines, known to the art, though with some, careful controls are necessary. The selection of a suitable pH for a given complexing agent has been well known in the art for a substantial period of time. Examples of specific complexing agents and required pH therefor can be found in the above referenced patents.

The reducing agent is, of course, a hypophosphite salt. It is preferably in a concentration of at least 0.05 moles per liter of solution and more preferably, in at least 0.10 moles per liter of solution. Generally, but not necessarily, the hypophosphite is used in molar excess of the plating metal.

The pH of the plating solution in accordance with this invention is at least 7 and preferably, when using the preferred carboxylic acid complexing agents, varies between about 8.0 and 14.0, and more preferably, between 8.0 and 11. Though a pH between 7 and 8 is useable under carefully controlled conditions, difficulties are encountered at the lower pH, particularly since pH has a tendency to drop as plating proceeds. Any pH adjustor typically used in the electroless plating are is suitable though ammonium hydroxide in significant concentration is preferably avoided.

In accordance with the invention, an autocatalytic promoter is added to a plating solution to render the solution an autocatalytic solution and/or to exalt the plating rate. The mechanism by which the promoter operates is not fully understood, but it is known that when the dissolved copper content in many plating solution having a pH below 11 exceeds about 5 percent by weight, dependent upon the specific solution used, the plating rate of the solution drops significantly and plating stops or continued build-up becomes infinitessimally small and the deposit formed is not autocatalytic, the latter phenomena probably accounting for the drop-off in plating rate. For example, a solution at a pH about 10 containing about 5 percent by weight copper and using citric acid as a complexing agent can codeposit copper in amounts ranging between about 5 and 20 percent by weight of the total alloy deposit in the absence of an autocatalytic promoter. When an adequate concentration of autocatalytic promoter is added to the solution, at the same solution pH, the concentration of copper in solution can approach about 95 percent weight, or more, though the concentration of complexing agent must be reduced before the plating rate drops significantly. A plating solution containing between about 50 and 70 percent dissolved copper deposits alloys having copper in concentrations approaching 95 percent or more of the total deposit and a solution containing 95 percent copper yields a deposit of 99 percent copper or more.

Suitable autocatalytic promoters of this invention preferably comprise compounds that contain oxy anions. Several of the oxy compounds are substantially more effective than others. Some are ineffective and even detrimental. Salts of carbonates and borates, particularly the alkali and alkaline earth metal salts thereof are especially useful and these compounds are preferred. Phosphates, such as sodium ortho phosphate and sodium meta phosphate, provide some benefit but are less effective than the carbonates and borates and must be used in higher concentrations. Other useful oxy compounds such as ethylene carbonate, fluoroborates (which are believed to be oxy compounds in hydrated form) and methoxides and ethoxides such as sodium methoxide and ethoxide are also autocatalytic promoters in higher concentrations. There are compounds containing oxy anions that have not, at this time, been found to be useful. Such compounds include chlorates and bromates.

Compounds useful as autocatalytic promoters can be easily determined by routine experimentation. For example, to determine if a compound is an autocatalytic promoter, a formulation would be prepared incapable of producing an autocatalytic deposit. A suitable formulation would be that of Example 32 below. To determine if a compound is a promoter, it would be added to a formulation such as that of Example 32 in varying amounts ranging from a few up to several hundred grams per liter. Parts would then be prepared for plating in a conventional manner and plated. Deposit thickness would be determined after about 10 minutes and about 30 minutes to determine if there is a continuous build-up of deposit. To avoid the effect of depletion of solution compounds for such testing purposes, small parts should be plating in relatively large volumes of solution—e.g., less than a total of 10 square inches to be plated in a liter of solution.

The solution concentration of the autocatalytic promoter can vary within wide limits from a trace to saturation, it being understood that the optimum concentration differs for different promoters. In general, the plating rate, and the maximum concentration of copper than can be tolerated in solution is effected by the concentration of the promoter in solution. As its concentration increases, plating rate, the maximum concentration of copper that can be tolerated in solution and the overall pH range increase up to a set maximum. In addition, it has been found that higher concentrations of promoter are needed for more difficult to plate substrates. For example, more promoter is needed to initiate plating over a copper substrate than plastic substrate catalyzed with palladium. With these guidelines, the promoter concentration can generally vary between about 1 gram per liter and saturation, and more preferably varies between about 5 and 50 grams per liter. With respect to the aforesaid ranges, it should be understood that a concentration of 1 gram per liter is too low for some promoters while saturation may be too high for others. The most accurate method for defining the concentration range for the promoter is that concentration sufficient to provide a continuous deposition of autocatalytic deposit at a plating rate of at least about 5 millionths of an inch per 10 minutes and preferably, in excess of 10 millionths of an inch per 10 minutes under standard conditions. In this respect, standard conditions are defined as a plating solution having its components maintained relatively constant by replenishment and operated at a temperatire of 120° F. if the solution is a copper-nickel solution and 150° F. is the solution is a copper-cobalt solution. To obtain this rate for a given promoter may require certain routine experimentation. It should be noted that the rate given is for any 10 minute interval during a plating cycle—e.g., the plating rate between 0 and 10 minutes should be about the same as the rate between 20 and 30 minutes.

To determine the concentration of plating metals in solution, it is necessary to consider both total metal concentration—i.e., the total of the copper and the nickel or cobalt, and the concentration of each metal individually. The total metal content of the solution is essentially as in the prior art and can vary between about 0.01 and 0.5 moles per liter (expressed as the metal) and preferably varies between about 0.02 and 0.1 moles per liter.

The concentration of each of the plating metals in solution, i.e., the copper and the nickel or cobalt, is dependent upon the desired amount of each in the alloy deposit, it being understood that the greater the concentration of one metal relative to the other in solution, the greater will be its concentration in the deposit. This relationship can be seen from FIG. 1 of the drawings which plots copper concentration for several plating solutions having different complexing agents as a function of copper concentration in the deposit obtained therefrom. It should be noted that the copper concentrations of the deposits are disproportionately higher than their corresponding concentrations in solution, establishing that copper plates from solution at a faster rate or preferentially to nickel or cobalt.

With further reference to FIG. 1, it should be noted that the curves terminate at between 50 and 70 weight percent copper in solution. The curves set forth the limits of the experiments used to obtain the curves. As described above, the copper in solution results in deposits that are not autocatalytic and plating stops when the copper concentration reaches a given level at any given solution pH. In the absence of an autocatalytic promoter, autocatalytic deposition would have stopped at 5 percent copper in solution and all deposition would have stopped at about 15 percent copper in solution. Consequently, the maximum amount of copper obtainable in the deposit would be about 20 percent by weight in a deposit that was autocatalytic and less than about 70 percent by weight in a deposit that was not autocatalytic. With the autocatalytic promoter in solution, autocatalytic deposition can take place with up to 60 to 70 percent copper in those solutions used to generate the curves of FIG. 1, thereby increasing the maximum amount of copper in the deposit. If the solution used to generate FIG. 1 were altered, such as, for example, by increasing the solution pH, higher copper concentrations could have been tolerated in solution.

As above, the concentration of copper in solution relative to the nickel or cobalt is dependent upon the particular alloy desired. The alloy deposits can contain copper in a concentration of from 1 to 99 percent by weight with the nickel or cobalt and phosphorus comprising the balance of the alloy. The alloys that are autocatalytic having a copper content in excess of 70 percent by weight, a phosphorus content of at least 0.1 percent with the balance nickel, and those having a copper concentration in excess of 25 percent, a phosphorus content of at least 0.01 percent with the balance cobalt are believed to be new compositions of matter. Those alloys having a copper content in excess of 70 weight percent are preferably, from 85 to 99 percent of the total alloy are especially useful and preferred for purposes of this invention. For such deposits, the phosphorus content is typically from a trace to 2 percent but can be as high as 10 percent with the nickel or cobalt comprising the balance of the alloy.

As above, copper codeposits at a more rapid rate than nickel or cobalt. Consequently, the concentration of copper in solution will exceed the concentration of the nickel or cobalt in the deposit. Therefore, to obtain an alloy having a concentration of copper of 25 percent by weight or more would require a copper content in solution of in excess of 5 percent by weight. For those alloys that are preferred—i.e., having a copper content in excess of 70 percent, the copper content in solution should exceed 20 percent by weight of the total of the plating metals and preferably should exceed 33 percent. For those alloys within the most preferred range of from 85 to 99 percent copper, the copper concentration in solution should be as high as possible so long as it is not so high as to cause the deposit to become non-autocatalytic and should comprise the major portion of the total of all of the plating metal in solution. For example, to obtain an alloy deposit containing in excess of 90 percent copper, the solution should contain at least 50 percent copper. Such solutions are preferred. More preferred are solutions having a copper content between about 50 and 95 percent copper.

Because copper codeposits at a faster rate than the nickel or cobalt, the solution is replenished with larger concentrations of copper than either nickel or cobalt to obtain uniform deposits from solution. Replenishment can be accomplished by continuously metering copper into the plating solution at a rate greater than other metallic solution components, by adding copper more frequently than the other components or by adding larger amounts of copper when the solution is replenished. With knowledge of the plating characteristics of the plating solution, replenishment would be well within the skill of the art recognizing that both copper and nickel or cobalt are added in proportion to their depletion from solution and preferably in sufficient quantity to maintain the plating rate and deposit composition constant. In practice, replenishment would typically require at least 1.0 parts by weight copper per part of nickel and preferably at least 4 parts copper per part of nickel.

In the following examples, test solutions were operated with moderate solution agitation, such as mixing or by aeration. Plating temperatures varied from room temperature to just below boiling, the higher temperatures providing a faster rate of deposition, as set forth in the examples.

EXAMPLES 1 THROUGH 5

A base solution prepared having the following composition on a per liter basis.

| Cupric sulfate pentahydrate | Variable |
|---|---|
| Nickel sulfate hexahydrate | Variable |
| Citric acid | 0.156 moles |
| Sodium hypophosphite monohydrate | 0.330 moles |
| Sodium tetraborate decahydrate | 0.016 moles |
| Potassium carbonate | 0.145 moles |
| Sodium hydroxide | to pH 10 |
| Water | to 1 liter |

The total of cupric sulfate pentahydrate and nickel sulfate hexahydrate was 0.050 moles.

Five test solutions were prepared, each having the above composition, but each differing from the other in the ratio of cupric to nickel ions in the solution. The ratios were as follows:

| | Metal in Solution | |
|---|---|---|
| Examples | Mole Percent Cupric Ion | Mole Percent Nickel Ion |
| Example 1 | 5 | 95 |
| Example 2 | 25 | 75 |
| Example 3 | 40 | 60 |
| Example 4 | 50 | 50 |
| Example 5 | 60 | 40 |

The test solutions were used to plate G-10 epoxy printed circuit laminates cut into parts measuring 1 by 4 inches. Each part was prepared for plating by scrub cleaning on both surfaces, conditioning with Shipley Conditioner 1175 at 150° F. for 5 minutes, a catalyst pre-dip in Shipley CATAPREP 44 at room temperature for 1 minute, catalysis for 3 minutes in a tin-palladium colloidal catalyst identified as CATALYST 44 at 100° F. and immersion in an Accelerator 19 solution at room temperature for 3 minutes. For each test solution, 6 parts were plated for 30 minutes at a temperature of about 120° F. All solutions gave satisfactory deposits having an average concentration of nickel and copper (omitting phosphorus from the calculation) as follows:

| | Metal in Deposit | |
|---|---|---|
| Examples | Percent Copper | Percent Nickel |
| Example 1 | 21 | 79 |
| Example 2 | 74 | 26 |
| Example 3 | 85 | 15 |
| Example 4 | 90 | 10 |
| Example 5 | 94 | 6 |

The concentration of phosphorus in the alloy deposits of Examples 1 through 5 varied up to 5 percent of the total deposit.

The results of Examples 1 through 5 were used to prepare FIG. 1, Curve A of the drawings. It should be understood that Curve A is generally representative of the deposition properties of one solution of this invention, but each specific solution will have its own deposition properties.

EXAMPLES 6 THROUGH 10

The procedures of Examples 1 through 5 were followed, but plating thickness was determined at 15 and 30 minutes using a microderm apparatus manufactured by Unit Process Assembly Company. The results obtained are set forth below.

| | Deposit Thickness (millionths) | |
|---|---|---|
| Examples | 15 minutes | 30 minutes |
| Example 6 | 7 | 17 |
| Example 7 | 15 | 36 |
| Example 8 | 50 | 91 |
| Example 9 | 52 | 106 |
| Example 10 | 64 | 140 |

The plating rate appeared to remain constant throughout the period of plating. The thicknesses obtained show that the deposits formed were autocatalytic.

EXAMPLES 11 THROUGH 25

Examples 1 through 5 were again repeated substituting other complexing agents for citric acid with the remainder of the plating solution remaining the same. In all examples, the concentration of the complexing agent was 0.176 moles per liter. The plating time was increased to 15 minutes. The complexing agent used, its concentration, the molar ratio of copper to nickel in solution and the percent copper in the deposit (omitting phosphorus from the calculation) are all set forth in the following table.

| Examples | Complexing Agent | Ratio Cu to Ni | Percent Cu In Deposit |
|---|---|---|---|
| 11 | Sulfosalicylic acid | 5/95 | 36.4 |
| 12 | " | 10/90 | 55.2 |
| 13 | " | 20/80 | 71.2 |
| 14 | " | 30/70 | 82.0 |
| 15 | " | 50/50 | 91.3 |
| 16 | Glucono lactone | 5/95 | 20.5 |
| 17 | " | 10/90 | 32.6 |
| 18 | " | 20/80 | 43.4 |
| 19 | " | 30/70 | 46.2 |
| 20 | " | 50/50 | 75.5 |
| 21 | Malic acid | 5/95 | 7.8 |
| 22 | " | 10/90 | 18.2 |
| 23 | " | 20/80 | 40.3 |
| 24 | " | 30/70 | 60.4 |
| 25 | " | 50/50 | 83.2 |

In all examples, the phosphorus content of the deposit was less than 5 percent and the balance of the deposit was nickel.

Examples 11 through 15 are graphically depicted in Curve B of FIG. 1, Examples 16 through 20 are graphically depicted in Curve C of FIG. 1 and Examples 21 through 25 are graphically depicted in Curve D of FIG. 1.

EXAMPLES 26 THROUGH 41

The following examples illustrate one function of the autocatalytic promoter. The formulation of Examples 26 through 41 is as follows:

| | |
|---|---|
| Nickel sulfate hexahydrate | Variable |
| Copper sulfate pentahydrate | Variable |
| Sodium hypophosphite monohydrate | 0.189 moles |
| Citric acid | 0.125 moles |
| Sodium hydroxide | to pH 10 |
| Water | to 1 liter |

Figure 2:
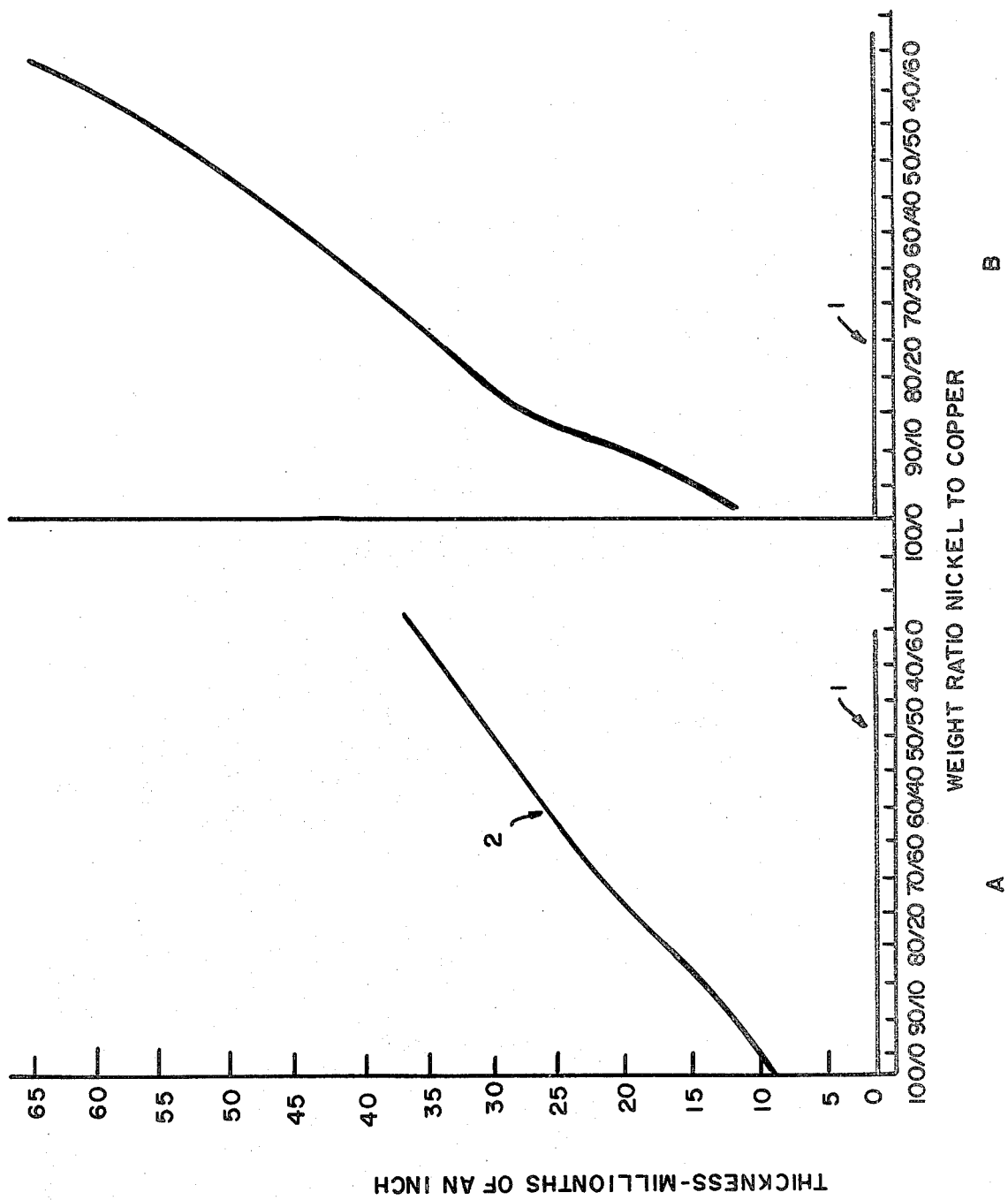
FIG. 2 is a graphical representation of deposit thickness as a function of the concentration of copper contained in a plating solution with and without an autocatalytic promoter.

The total of the nickel and copper sulfates was 0.050 moles per liter but for purposes of these examples, the two metals were used in differing ratios. In Examples 26 through 33, no promoter was used but in Examples 24 through 41, a combination of 0.0015 moles of sodium tetraborate and 0.145 moles of potassium carbonate were added. The solutions were used to plate G-10 epoxy following the procedure of Example 1 at a solution temperature of 120° F. and a total plating time of 10 minutes. The amount of nickel and copper and plating rate in millionths of an inch are set forth in the following table and graphically represented in FIG. 2a where Curve 1 represents a solution free of promoter and Curve 2 represents the same solution containing promoter.

| | Metal In Solution | | |
|---|---|---|---|
| Example | Percent Nickel | Percent Copper | Deposit Thickness |
| Without Promoter | | | |
| 26 | 100 | 0 | 2 |
| 27 | 95 | 5 | 2 |
| 28 | 90 | 10 | 2 |
| 29 | 85 | 15 | 3 |
| 30 | 75 | 25 | 3 |
| 31 | 60 | 40 | 3 |
| 32 | 50 | 50 | 3 |
| 33 | 40 | 60 | 3 |
| With Promoter | | | |
| 34 | 100 | 0 | 8 |
| 35 | 95 | 5 | 10 |
| 36 | 90 | 10 | 13 |
| 37 | 85 | 15 | 15 |
| 38 | 75 | 25 | 22 |
| 39 | 60 | 40 | 27 |
| 40 | 50 | 50 | 32 |
| 41 | 40 | 60 | 37 |

EXAMPLES 42 THROUGH 53

Repetition of the above examples with a higher solution temperature results in thicker deposits with promoter as expected, but with no change in deposit thickness in the absence of promoter. This is illustrated in Examples 42 through 53, where Examples 42 through 48 represent tests where no promoter was added and Examples 49 through 53 represent tests with promoter added. The following table sets forth the relative concentrations of the two metals and the deposit thickness in millionths of an inch for a solution operated at 165° F. for 10 minutes. The results are graphically represented in FIG. 2B where Curve 1 sets forth the results of Examples 42 through 48 and Curve 2 sets forth the results for Examples 29 through 53.

| | Metal In Solution | | |
|---|---|---|---|
| Examples | Percent Nickel | Percent Copper | Deposit Thickness |
| Without Promoter | | | |
| 42 | 100 | 0 | 2 |
| 43 | 95 | 5 | 2 |
| 44 | 85 | 15 | 2 |
| 45 | 75 | 25 | 2 |
| 46 | 60 | 40 | 2 |
| 47 | 40 | 10 | 2 |
| With Promoter | | | |
| 48 | 100 | 0 | 12 |
| 49 | 95 | 5 | 15 |
| 50 | 85 | 15 | 28 |
| 51 | 75 | 25 | 35 |
| 52 | 60 | 40 | 45 |
| 53 | 40 | 60 | 66 |

The above data reveals that one function of the promoter is to promote autocatalytic deposition. In those examples where promoter is omitted, following the formation of an initial thin deposit, plating virtually stops, indicating that the deposits are not autocatalytic. In those examples where promoter is added, the plating reaction continues and surprisingly proceeds at a faster rate as the copper concentration increases.

EXAMPLES 54 AND 55

In Example 54, 0.131 moles of sodium tetraborate were substituted for the combination of sodium tetraborate and potassium carbonate as used in Example 5. In Example 55, 0.362 moles of potassium carbonate were substituted for the combination. For each example, the deposits were substantially the same as that obtained from Example 5 and over 90 percent copper was found in the deposit.

EXAMPLES 56 THROUGH 61

The following base solution was prepared:

| | |
|---|---|
| Cupric sulfate pentahydrate | 0.024 moles |
| Nickel sulfate hexahydrate | 0.023 moles |
| Citric acid | 0.156 moles |
| Sodium hypophosphite | 0.330 moles |
| Sodium tetraborate (borax) | Variable |
| Sodium hydroxide | to pH 10 |
| Water | to 1 liter |

Using parts prepared following the procedure of Example 1, deposit thickness was measured after 10 minutes of plating at a solution temperature of 120° F. The sodium tetraborate concentration and deposit thickness in millionths of an inch are as follows:

| Examples | Borax Concentration (moles) | Deposit Thickness |
|---|---|---|
| 56 | 0 | 1 |
| 57 | 0.0026 | 1 |
| 58 | 0.0079 | 1 |
| 59 | 0.0157 | 2 |
| 60 | 0.0315 | 16 |
| 61 | 0.0787 | 17 |

It should be understood that the rate cannot be sustained without replenishment of the solution as solution components are consumed.

EXAMPLES 62 THROUGH 67

The procedure of Examples 56 through 61 was repeated with potassium carbonate substituted for sodium borate in variable concentration and plating time was increased to 15 minutes. The results are as follows:

| Examples | Potassium Carbonate Concentration (moles) | Deposit Thickness |
| --- | --- | --- |
| 62 | 0 | 1 |
| 63 | 0.036 | 3 |
| 64 | 0.072 | 4 |
| 65 | 0.144 | 16 |
| 66 | 0.289 | 15 |
| 67 | 0.687 | 26 |

Figure 3:
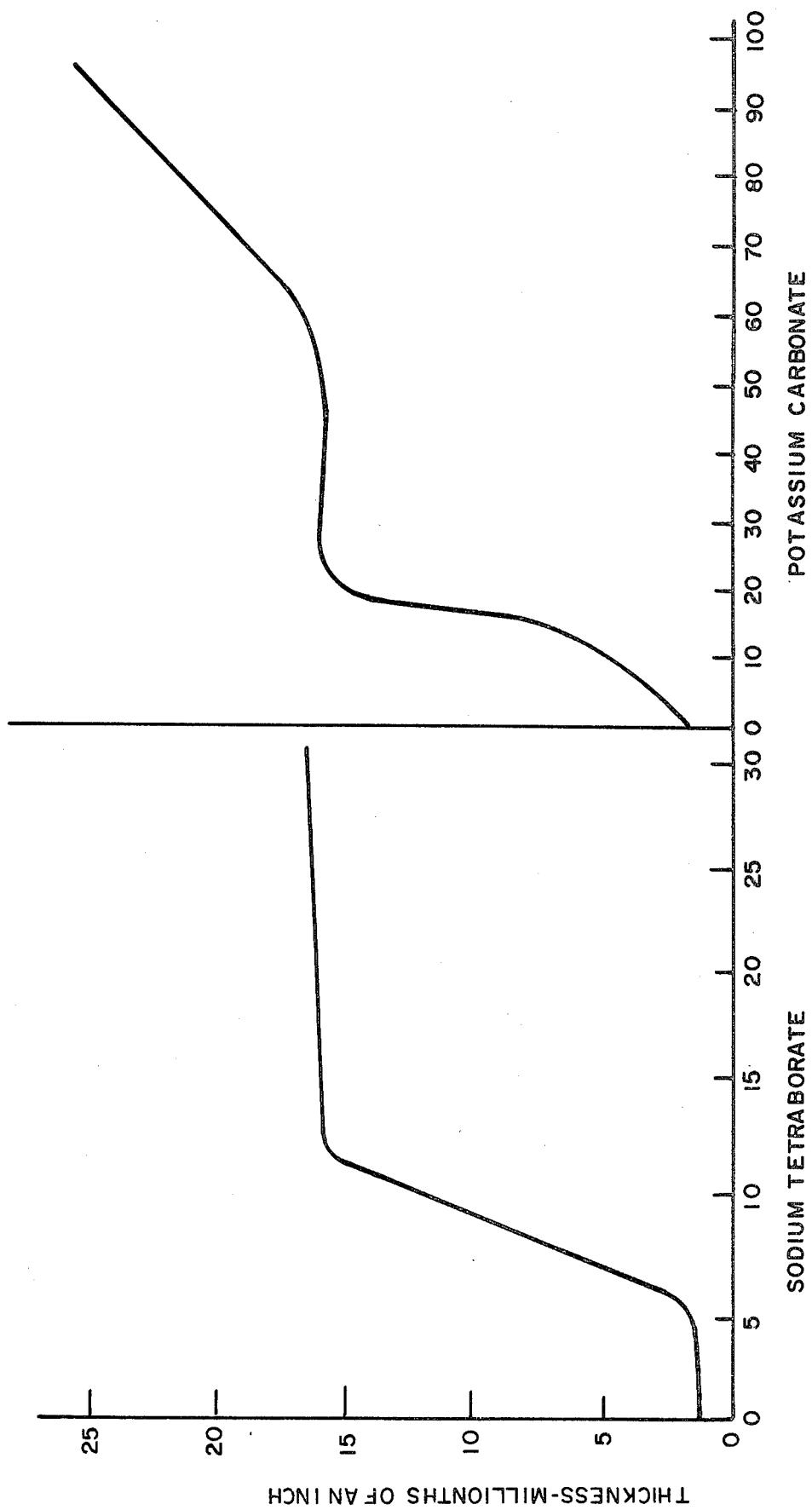
FIG. 3 is a graphical representation of deposit thickness as a function of the concentration of several autocatalytic promoters contained in a plating solution.

The results of Examples 56 through 61 are graphically represented as Curve A of FIG. 3 of the drawings and the results of Examples 62 through 67 are graphically represented as Curve B of FIG. 3.

Recognizing that each of copper sulfate and nickel sulfate was used in the same concentration in the above examples, it is apparent that a continuous plating rate of 10 or more millionths of an inch per 10 minutes is possible if an autocatalytic promoter is present in adequate concentration. For the sodium tetraborate, this concentration was at some point intermediate between 0.01 and 0.03 moles per liter. For any given formulation, an adequate amount of promoter can be determined by routine experimentation, but this amount will vary from formulation to formulation.

EXAMPLES 68 through 74

The following examples illustrate the use of alternative promoters using the following base formulation:

| Nickel sulfate hexahydrate | 0.030 moles |
| --- | --- |
| Cupric sulfate pentahydrate | 0.016 moles |
| Sodium hypophosphite | 0.330 moles |
| Citric acid | 0.125 moles |
| Promoter | Variable |
| Sodium hydroxide | to pH 10 |
| Water | to 1 liter |

Various autocatalytic promoters were added to the base solution and the solution was then used to plate G-10 epoxy by plating for 30 minutes at 120° F. The promoters used, their concentration and deposit thickness in millionths of an inch after 30 minutes is as set forth in the following table:

| Examples | Promoter | Concentration Moles per Liter | Deposit Thickness |
| --- | --- | --- | --- |
| 68 | None | — | 5 |
| 69 | Potassium Carbonate | 0.181 | 90 |
| 70 | Sodium methylate | 0.463 | 42 |
| 71 | Sodium orthophosphate | 0.187 | 41 |
| 72 | Sodium fluoroborate | 0.455 | 68 |
| 73 | Ethylene carbonate | 0.674 | 94 |
| 74 | Propylene carbonate | 0.485 | 72 |

All baths were active and capable of continued plating after 30 minutes except the bath of Example 68.

EXAMPLE 75

One method for increasing the phosphorus content of the alloy is to increase hypophosphite content. This is illustrated by the following formulation:

| Nickel sulfate hexahydrate | 0.034 moles |
| --- | --- |
| Copper sulfate pentahydrate | 0.012 moles |
| Citric acid | 0.208 moles |
| Potassium carbonate | 0.145 moles |
| Sodium tetraborate | 0.016 moles |
| Sodium hypophosphite | 0.943 moles |
| Sodium hydroxide | to pH 10 |
| Water | to 1 liter |

The above formulation was used to plate G-10 epoxy following the procedure of Example 1 at a temperature of 80° F. The deposit comprised 73% copper, 22% nickel and 5% phosphorus.

EXAMPLES 76 through 81

For the following examples, the base formulation of Example 68 was used substituting 0.092 moles of pentahydroxypropyldiethylene triamine for citric acid as the complexing agent. The pH was adjusted to 12.1 and the solution was operated at 120° F. to plate G-10 epoxy following the procedure of Example 1. The promoter used, its concentration and the deposit thickness in millionths of an inch after 30 minutes of plating is set forth in the following table:

| Example | Promoter | Concentration Moles/liter | Deposit Thickness |
| --- | --- | --- | --- |
| 76 | None | — | 8 |
| 77 | Potassium carbonate | 0.0362 | 79 |
| 78 | Sodium tetraborate | 0.131 | 34 |

The procedure of Examples 76 through 78 was repeated substituting about one mole of ammonium chloride for citric acid. The pH was adjusted to 8.0. The results obtained are set forth below:

| Example | Promoter | Concentration Moles/liter | Deposit Thickness |
| --- | --- | --- | --- |
| 79 | None | — | 5 |
| 80 | Potassium carbonate | 0.0362 | 50 |
| 81 | Sodium tetraborate | 0.131 | 90 |

Though relatively thick deposits were obtained using ammonium hydroxide, the deposit was lesser preferred as its quality was poor. It was dark, chocolate brown and powdery. More careful control of solution pH might improve these properties.

EXAMPLES 82 through 97

The use of an autocatalytic promoter permits expansion of the useful pH range over which the plating reaction takes place. This is illustrated in the following examples using the base formulation in the table below:

| Nickel sulfate hexahydrate | 0.030 moles |
| --- | --- |
| Copper sulfate pentahydrate | 0.016 moles |
| Citric acid | 0.125 moles |
| Sodium hypophosphite | 0.189 moles |
| pH adjuster | Variable |
| Water | to 1 liter |

Figure 4:
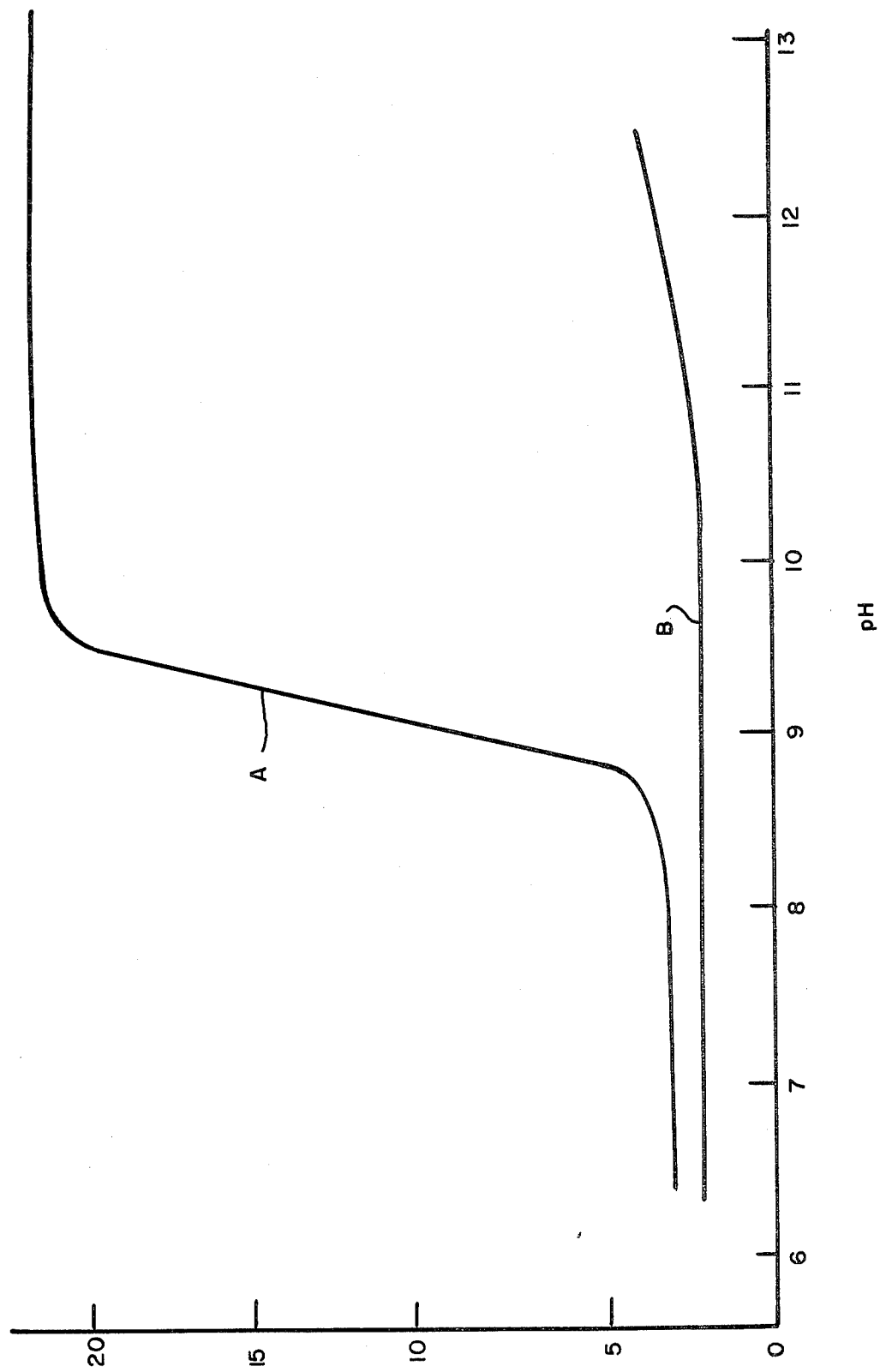
FIG. 4 is a graphical representation of deposit thickness as a function of solution pH.

The pH was the variable and was adjusted with either sodium hydroxide or sulfuric acid dependent upon the desired pH. For Examples 82 through 89, no promoter was used while in Examples 90 through 97, a promoter combination of 0.015 moles per liter of sodium tetraborate and 0.145 moles per liter of potassium carbonate was used. G-10 parts were plated following the procedure of Example 1 for 10 minutes at 120° F. The results are set forth in the following table and graphically represented in FIG. 4 where Curve A represents formulations containing promoter and Curve B represents formulations free of promoter.

| Examples | pH | Deposit Thickness |
|---|---|---|
| Without Promoter | | |
| 82 | 6.7 | 2 |
| 83 | 8.0 | 2 |
| 84 | 9.0 | 2 |
| 85 | 9.8 | 2 |
| 86 | 10.3 | 2 |
| 87 | 11.3 | 3 |
| 88 | 12.5 | 4 |
| 89 | 13.0 | 10 |
| With Promoter | | |
| 90 | 6.7 | 3 |
| 91 | 7.7 | 3 |
| 92 | 8.7 | 4 |
| 93 | 9.5 | 22 |
| 94 | 10.5 | 23 |
| 95 | 11.0 | 23 |
| 96 | 12.0 | 23 |
| 97 | 13.0 | 23 |

Of the above examples, Example 89 gave a deposit of a thickness greater than anticipated. For this reason, the example was repeated but the time for deposition was increased to 30 minutes. The deposit thickness was found to be 11 millionths of an inch. Hence, no further buildup of deposit occurred between 10 and 30 minutes establishing that the deposit was not autocatalytic.

EXAMPLES 98 through 106

Examples 90 through 97 were repeated with temperature increased to 150° F. The results are set forth in the following table:

| Examples | pH | Deposit Thickness |
|---|---|---|
| 98 | 6.7 | 5 |
| 99 | 7.7 | 5 |
| 100 | 8.7 | 9 |
| 101 | 9.5 | 25 |
| 102 | 10.5 | 27 |
| 103 | 11.0 | 26 |
| 104 | 12.0 | 24 |
| 105 | 13.0 | 24 |
| 106 | 13.5 | 29 |

From the above, it can be seen that increasing the temperature of the plating solution can assist in the formation of an autocatalytic deposit and can exalt the plating rate.

EXAMPLES 107 through 110

The following base formulation was prepared:

| | |
|---|---|
| Cobalt sulfate hexahydrate | Variable |
| Copper sulfate pentahydrate | Variable |
| Citric acid | 0.030 moles |
| Sodium hypophosphite | 0.016 moles |
| Potassium carbonate | 0.125 moles |
| Sodium tetraborate | 0.189 moles |
| Sodium hydroxide | to pH 10 |
| Water | to 1 liter |

The total of the cobalt and copper sulfates was 10 grams. Plating was performed over G-10 epoxy following the procedures of Example 1. The relative concentrations of cobalt and copper in solution and the deposit thickness in millionths of an inch in 10 minutes at 165° F. are set forth in the following table:

| Example | Molar Ratio of Metal in Solution | | Deposit Thickness |
|---|---|---|---|
| | Cobalt | Copper | |
| 107 | 90 | 10 | 8 |
| 108 | 80 | 20 | 25 |
| 109 | 70 | 30 | 45 |
| 110 | 60 | 40 | 60 |

Repetition of the above examples at a plating temperature of 80° F. was unsatisfactory as it was difficult to initiate plating with baths containing in excess of 30% copper.

EXAMPLES 111 and 112

The above examples were repeated but the copper salt content of the solution of Example 111 was 16% and Example 112 was 25%. The deposit compositions from these examples are as follows:

| Example | Weight Percent Component | | |
|---|---|---|---|
| | Cu | Co | P |
| 111 | 77.6 | 18.5 | 3.9 |
| 112 | 84.4 | 11.4 | 2.2 |

EXAMPLES 113 and 114

Examples 111 and 112 were repeated but the total metal content was increased and nickel sulfate hexahydrate was added to solution. The metal content in solution and in the deposit is set forth in the following table:

| | Examples | |
|---|---|---|
| | 113 | 114 |
| Solution Composition (moles) | | |
| Nickel sulfate hexahydrate | 0.030 | 0.030 |
| Copper sulfate pentahydrate | 0.016 | 0.016 |
| Cobalt sulfate hexahydrate | 0.004 | 0.004 |
| Deposition Composition (percent) | | |
| Nickel | 9.1 | 8.7 |
| Copper | 89.9 | 88.7 |
| Cobalt | 0.4 | 1.7 |
| Phosphorus | 0.7 | 0.9 |
| Examples 115 and 116 | | |
| Nickel sulfate heptahydrate | 0.030 moles | |
| Copper sulfate hexahydrate | 0.016 moles | |
| Citric acid | 0.125 moles | |
| Sodium hypophosphite | 0.032 moles | |
| Sodium hydroxide | to pH 7.5 to 8 | |
| Water | to 1 liter | |

The above formulation was used in accordance with the procedures of Example 1. Plating was continued for 20 minutes at a temperature of 120° F. The deposit obtained has a thickness of 2 millionths of an inch. An autocatalytic promoter was then added to the solution. The promoter comprised 0.145 moles of potassium carbonate and 0.147 moles of borax. The plating procedure was repeated and the deposit obtained was of a thickness of 40 millionths of an inch.

The autocatalytic promoter of the invention is capable of converting a plating solution incapable of depositing an autocatalytic deposit to one capable of depositing an autocatalytic deposit. This is illustrated in the following examples where a high copper content is used whereby the plating solution is essentially inactive in the absence of the promoter.

EXAMPLES 117 THROUGH 134

| | |
|---|---|
| Copper sulfate pentahydrate | 0.022 to 0.024 moles |
| Nickel sulfate hexahydrate | Variable |
| Sodium tetraborate decahydrate | Variable |
| Citric acid | 0.022 moles |
| Sodium hydroxide | to pH 10 |
| Sodium hypophosphite monohydrate | 0.19 moles |
| Water | to 1 liter |
| Solution temperature | 140° F. |

The results with and without promoter using the plating procedure of Example 1 are set forth in the following table:

| Example | Percent Nickel | Percent Copper | Tetraborate Content (moles) | Plating Thickness (microinches) 10 minutes | 30 minutes |
|---|---|---|---|---|---|
| 117 | 40 | 60 | 0 | 2 | 5 |
| 118 | 35 | 65 | 0 | 2 | 2 |
| 119 | 30 | 70 | 0 | 3 | 4 |
| 120 | 25 | 75 | 0 | 2 | 4 |
| 121 | 20 | 80 | 0 | 2 | 4 |
| 122 | 15 | 85 | 0 | 3 | 10 |
| 123 | 10 | 90 | 0 | 3 | 6 |
| 124 | 5 | 95 | 0 | 3 | 5 |
| 125 | 0 | 100 | 0 | 2 | 7 |
| 126 | 40 | 60 | 0.026 | 20 | 49 |
| 127 | 35 | 65 | 0.026 | 18 | 63 |
| 128 | 30 | 70 | 0.026 | 21 | 54 |
| 129 | 24 | 75 | 0.026 | 19 | 60 |
| 130 | 20 | 80 | 0.026 | 18 | 63 |
| 131 | 15 | 85 | 0.026 | 19 | 73 |
| 132 | 10 | 90 | 0.026 | 22 | 71 |
| 133 | 5 | 95 | 0.026 | 21 | 68 |
| 134 | 0 | 100 | 0.026 | 0 | 0 |

The above data illustrates that copper can be tolerated in the solution containing the borate in amounts up to 95 mole percent before the solution becomes inactive. It should be noted that the molar ratio of complexing agent to metal in these examples is slightly less than 1 to 1. Higher molar ratios tend to inactivate the solution. The molar ratio used in the examples is lower than normally preferred.

As described above, the promoters can reduce the pH of a plating solution necessary to obtain an autocatalytic deposit and can also exalt the plating rate. This is illustrated in the following examples:

EXAMPLES 135 THROUGH 146

| | |
|---|---|
| Copper sulfate pentahydrate | 0.041 moles |
| Nickel sulfate hexahydrate | 0.005 moles |
| Citric acid | 0.044 moles |
| Sodium hydroxide | to variable pH |
| Sodium hypophosphite | 0.19 moles |
| Sodium tetraborate decahydrate | variable |
| Water | to 1 liter |
| Temperature | 140° F. |

The results with and without promoter using the plating procedure of Example 1 are set forth in the following table:

| Example | pH | Tetraborate Content (moles) | Plating Thickness (microinches) 10 minutes | 30 minutes |
|---|---|---|---|---|
| 135 | 7 | 0 | 3 | 11 |
| 136 | 8 | 0 | 8 | 13 |
| 137 | 9 | 0 | 8 | 13 |
| 138 | 10 | 0 | 6 | 9 |
| 139 | 11 | 0 | 5 | 8 |
| 140 | 12 | 0 | 5 | 5 |
| 141 | 7 | 0.025 | 5 | 13 |
| 142 | 8 | 0.025 | 2 | 3 |
| 143 | 9 | 0.025 | 2 | 1 |
| 144 | 10 | 0.025 | 18 | 19 |
| 145 | 11 | 0.025 | 28 | 32 |
| 146 | 12 | 0.025 | 40 | 75 |

At a pH of from 12.5 to 13, the plating solution of the above examples would have been expected to plate with or without promoter. The results illustrate that the promoter effectively reduced the pH at which plating occurred and exalted the rate at this lower pH.

Those autocatalytic deposits in accordance with this invention, having a copper content in excess of 70 mole percent possess properties that are unique and exceptional for both plating on plastics and electronics applications. Though the alloys are predominantly copper, they possess many of the desirable properties of nickel and the presence of the nickel in the deposit does not detract appreciably from the desirable properties of copper. For example, the allow deposit possesses electrical conductivity approaching that of pure copper, when plated in sufficiently thick sections—i.e., about 15 millionths of an inch or greater. In addition, the alloy does not passivate as does nickel. Further, the alloy has the etch properties of copper and parts are readily reworked.

EXAMPLES 147 through 149

The following examples illustrate the ability of the preferred alloys of the invention to resist passivation. For examples, the formulation of Example 40 was compared to a standard electroless copper and a separate standard electroless nickel solution. The electroless copper solution used was PM 990 electroless copper and the electroless nickel was PM 980 electroless nickel, both of Shipley Company Inc. All solutions were plated over ABS which had been pretreated by the standard Crownplate treatment comprising an organic solvent based conditioner, chromic acid etch, catalysis and acceleration. Following electroless plating, the parts were left exposed to the atmosphere for 24 hours. Thereafter, the parts were dipped in sulfuric acid and electroplated in a Lea-Ronal Bright Acid copper bath at 20 amps per square foot for 1 hour. There was excellent adhesion between electrolytic copper and both the deposits of this invention and those from the 990 copper, but the bond between the electroless nickel and the electrolytic copper failed.

EXAMPLES 150 through 152

The above procedure was repeated, but the substrate plated was G-10 epoxy for a period of time sufficient to form a deposit having a thickness of 15 millionths of an inch. The deposits so formed were then etched in various etchants until the deposit was dissolved or the test discontinued. The etchants used and results obtained are set forth below:

|  | Etchant | | |
| --- | --- | --- | --- |
| Deposit | Chromic/sulfuric[1] 100° F. | Nitric Acid (20%) 80° F. | Ammonium Persulfate (20%) 80° F. |
| Nickel copper alloy (approx. 85% copper) | etched within 1 minute | etched within 1 minute | etched within 1 minute |
| 990 Copper | etched within 30 seconds | etched within 30 seconds | etched within 30 seconds |
| 980 Nickel | did not etch within 2 minutes | darkened - did not etch within 2 minutes | darkened - did not etch within 2 minutes |

[1]Comprises 4 ½ to 5 pounds chromic acid and, 1% sulfuric acid in 1 gallon of water.

The above results show that a copper-nickel alloy containing less than 15% does not appreciably change etching characteristics as compared to electroless copper. This is an advantage in cleaning racks and reworking parts, as compared to electroless nickel.

The allow deposits can be plated over any catalytic surface in the same manner as the electroless deposits of the prior art. Such surfaces include plastic surfaces activated with a catalyst and various catalyzed metals such as nickel, cobalt, iron, steel, aluminum, zinc, palladium, platinum, copper, brass, manganese, chromium, molybdenum, titanium, silver, carbon and graphite. The parts are prepared as in the prior art. For example, steel would be etched in dilute hydrochloric acid prior to plating and aluminum would be subjected to a zincate process. If difficulty is encountered in take-off, galvanic initiation can be used where the part to be plated is touched with a part that is catalytic or can be electrolytically initiated. On difficultly plateable substrates, increasing the concentration of the autocatalytic promoter is desirable.

The deposits of this invention can be used for electroless applications, decorative applications and for plating on plastics. Such plastics include, by way of example epoxies, polyamides, ABS, polycarbonates, polyesters, noryl, polyamides, phenolics, polysulfones, polyphenylene sulfides, cellulose acetate, polystyrene, and blends and copolymers of the foregoing.

For use in electronics application, the alloys may be deposited over an activated substrate in a circuit board pattern and onto the walls of through holes and onto lands surrounding the through holes in the same manner as electroless copper has been used in the prior art. The alloy deposit can be used either as a base for subsequent electroplating with copper or in an additive process, can be used as the sole deposit. In an additive process, the alloy deposits of the invention may be overcoated with electrolytic solder or processed in any other manner conventional in the printed circuit art. In any electronics application, the deposits can be used for multilayer construction whereby one circuit pattern is electrically isolated from another placed directly over it such as by a solder mask. In this way, the alloy would be deposited onto a laminated structure. A laminated structure can be used for non-electronic applications as well as in the manufacture of printing plates. Hence, the alloy can be plated over plastic which is laminated to metal or over metal laminated to plastic. The alloy can also be plated over ceramics such as silicon dioxide in the manufacture of semiconductors. For plating on plastics operations, the alloy deposit serves as a base layer for subsequent electroplating. Dependent upon the particular plating on plastics application, it is subsequently electroplated with any of a variety of metals such as chromium, nickel, rhodium or the like.

We claim:

1. A structure comprising a catalytic surface plated with an autocatalytic electroless alloy of copper, cobalt and phosphorous where the copper comprises at least 25 percent by weight of the alloy, the phosphorous comprises from 0.1 to 10 percent by weight of the alloy and the cobalt comprises the balance of the alloy.

2. A structure comprising a catalytic surface plated with an autocatalytic electroles alloy of copper, nickel, and phosphorous where the copper comprises from 70 to 99 percent by weight of the deposit, the phosphorous comprises from 0.1 to 10 percent by weight of the alloy and the nickel comprises the balance of the alloy.

3. The structure of claim 2 where the surface is plastic.

4. The structure of claim 2 where the surface is a ceramic.

5. The structure of claim 2 where the catalyzed surface is selected from the group of metals, plastics and ceramics.

6. The structure of claim 5 in the form of a laminate.

7. The structure of claim 6 comprising metal layered over plastic.

8. The structure of claim 7 where the surface is metallic.

9. The structure of claim 8 where the metal is selected from the group of iron and its alloys, nickel, aluminum and copper.

10. The structure of claim 2 where the surface is a printed circuit board base material.

11. The structure of claim 10 as a multilayered board.

12. The structure of claim 10 where the alloy is in a printed circuit pattern.

13. The structure of claim 10 where the alloy is on the walls of holes through the printed circuit board base material joining the front and rear surfaces of the same.

14. The structure of claim 13 where the alloy also comprises lands surrounding said plated holes.

15. The structure of claim 2 where the alloy is coated with a member from the group of metals and organic coating materials.

16. The structure of claim 15 where the alloy is coated with a metal.

17. The structure of claim 16 where the metal is an electrolessly plated metal.

18. The structure of claim 16 where the metal is an electrolytically plated metal.

19. The structure of claim 18 where the metal is selected from the group of lead, tin, solder, gold, silver, copper, nickel, zinc and cadmium.

20. The structure of claim 2 where the catalyzed surface is the surface of a formed plastic.

21. The structure of claim 20 where the formed plastic is a cast film.

22. The structure of claim 20 where the formed plastic is an extruded part.

23. The structure of claim 20 where the formed plastic is a molded part.

24. The structure of claim 23 where the molded part is a printed circuit board base material.

25. The structure of claim 20 where the plastic is selected from the group of epoxies, polyamides, ABS, polycarbonate, polyesters, mixtures of polystyrene with polyphenylene oxide, polyamides, phenolics, polysulfones, polyphenylene sulfides, cellulose acetates, polystyrene and mixtures thereof.

26. The structure of claim 25 where the molded plastic is a polyamide.

27. The structure of claim 25 where the plastic is an epoxy.

28. The structure of claim 25 where the plastic is a polyester.

29. The structure of claim 25 where the plastic is ABS.

30. The structure of claim 25 where the plastic is an applied coating over a surface.

* * * * *